United States Patent
Lee et al.

(10) Patent No.: US 11,664,826 B2
(45) Date of Patent: May 30, 2023

(54) ERROR CORRECTION CODE ENGINE PERFORMING ECC DECODING, OPERATION METHOD THEREOF, AND STORAGE DEVICE INCLUDING ECC ENGINE

(71) Applicant: SAMSUNG ELECTRONICS CO., LTD., Suwon-si (KR)

(72) Inventors: Kangseok Lee, Seoul (KR);
Geunyeong Yu, Seongnam-si (KR);
Heeyoul Kwak, Namyangju-si (KR);
Hongrak Son, Anyang-si (KR);
Dongmin Shin, Seoul (KR); Wijik Lee, Suwon-si (KR); Bohwan Jun, Seoul (KR); Youngjun Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/478,002

(22) Filed: Sep. 17, 2021

(65) Prior Publication Data
US 2022/0182073 A1    Jun. 9, 2022

(30) Foreign Application Priority Data
Dec. 7, 2020    (KR) .................. 10-2020-0169841

(51) Int. Cl.
*H03M 13/29*      (2006.01)
*H03M 13/09*      (2006.01)
(Continued)

(52) U.S. Cl.
CPC ...... *H03M 13/2948* (2013.01); *H03M 13/096* (2013.01); *H03M 13/1108* (2013.01); *H03M 13/1575* (2013.01)

(58) Field of Classification Search
CPC .................................................. H03M 13/2948
See application file for complete search history.

(56) References Cited

U.S. PATENT DOCUMENTS 5,974,580 A * 10/1999 Zook ................. H03M 13/1515
714/755
6,604,220 B1 * 8/2003 Lee ................... H03M 13/2957
714/755
(Continued)

FOREIGN PATENT DOCUMENTS

| JP | 2013-070289 | 4/2013 |
| JP | 2015-032885 | 2/2015 |
| KR | 10-1529880 | 6/2015 |

*Primary Examiner* — Joseph D Torres
(74) *Attorney, Agent, or Firm* — F. Chau & Associates, LLC

(57) ABSTRACT

A method of responding to a read request from a host includes: obtaining read data from a memory device, performing first iteration ECC decoding on the read data to generate a plurality of pieces of decoded data, selecting one of the plurality of pieces of decoded data as intermediate data as intermediate data, generating preprocessed data based on the read data and the intermediate data and performing second iteration ECC decoding on the preprocessed data when the first iteration ECC decoding fails, and outputting the intermediate data to the host when the first iteration ECC decoding succeeds.

14 Claims, 10 Drawing Sheets

(51) Int. Cl.
*H03M 13/15* (2006.01)
*H03M 13/11* (2006.01)

(56) References Cited

U.S. PATENT DOCUMENTS

| | | | | |
|---|---|---|---|---|
| 6,668,349 | B1* | 12/2003 | Sawaguchi | G11B 20/10055 |
| | | | | 714/755 |
| 8,281,212 | B1* | 10/2012 | Yeung | H03M 13/612 |
| | | | | 714/755 |
| 8,316,279 | B2 | 11/2012 | Kim et al. | |
| 8,843,807 | B1* | 9/2014 | Stirling | H03M 13/2987 |
| | | | | 714/795 |
| 8,887,031 | B2 | 11/2014 | Horita | |
| 9,509,342 | B2 | 11/2016 | Vernon | |
| 10,536,172 | B2 | 1/2020 | Ilani et al. | |
| 2003/0131305 | A1* | 7/2003 | Taguchi | H03M 13/2957 |
| | | | | 714/755 |
| 2005/0177679 | A1* | 8/2005 | Alva | G06F 11/1064 |
| | | | | 711/104 |
| 2006/0020874 | A1* | 1/2006 | Desai | H03M 13/453 |
| | | | | 714/780 |
| 2011/0305082 | A1* | 12/2011 | Haratsch | G11C 11/5607 |
| | | | | 365/185.18 |
| 2013/0145235 | A1* | 6/2013 | Alhussien | G06F 11/1008 |
| | | | | 714/773 |
| 2015/0188577 | A1* | 7/2015 | Ogawa | G06F 11/1012 |
| | | | | 714/759 |
| 2018/0076832 | A1* | 3/2018 | Haga | H03M 13/458 |
| 2019/0173495 | A1* | 6/2019 | Freudenberger | H03M 13/2993 |
| 2020/0091941 | A1 | 3/2020 | Watanabe | |

\* cited by examiner

ERROR CORRECTION CODE ENGINE PERFORMING ECC DECODING, OPERATION METHOD THEREOF, AND STORAGE DEVICE INCLUDING ECC ENGINE

CROSS-REFERENCE TO RELATED APPLICATION

This U.S. non-provisional patent application claims priority under 35 U.S.C. § 119 to Korean Patent Application No. 10-2020-0169841, filed on Dec. 7, 2020, in the Korean Intellectual Property Office, the disclosure of which is incorporated by reference in its entirety herein.

1. Technical Field

The inventive concept relates to an error correction code (ECC) engine, and more particularly, to an ECC engine configured to perform ECC decoding, an operating method thereof, and a storage device including the ECC engine.

2. Discussion of Related Art

Data may be encoded with redundant information in the form of an ECC. The redundancy can be used to detect a limited number of errors in the data. An ECC decoding may be performed on the encoded data to detect the errors and potentially correct the errors.

However, conventional ECC decoding is not always able to correct all errors. Thus, it is necessary to improve the reliability and correcting capability of ECC decoding.

SUMMARY

At least one embodiment of the inventive concept provides an error correction code (ECC) engine configured to perform ECC decoding to improve error correction capability by performing ECC decoding by using a plurality of pieces of decoded data generated in an ECC decoding process when the ECC decoding fails, an operation method thereof, and a storage device including the ECC engine.

According to an exemplary embodiment of the inventive concept, there is provided a method of responding to a request from a host. The method includes obtaining read data from a memory device; performing first iteration ECC decoding on the read data to generate a plurality of pieces of decoded data, selecting one of the plurality of pieces of decoded data as intermediate data, generating preprocessed data based on the read data and the intermediate data and performing second iteration ECC decoding on the preprocessed data when the first iteration ECC decoding fails, and outputting the intermediate data to the host when the first iteration ECC decoding succeeds.

According to an exemplary embodiment of the inventive concept, there is provided an ECC engine including an ECC decoder and a preprocessor. The ECC decoder is configured to perform first iteration ECC decoding on read data obtained from a memory device to generate a plurality of pieces of decoded data, and select one of the plurality of pieces of decoded data as intermediate data. The preprocessor is configured to generate preprocessed data based on the read data and the intermediate data when the first iteration ECC decoding fails. The ECC decoder performs second iteration ECC decoding by using the preprocessed data when the first iteration ECC decoding fails.

According to an exemplary embodiment of the inventive concept, there is provided a storage device including a memory controller and a memory device. The memory controller includes an error correction coding (ECC) engine configured to perform a first ECC decoding on read data obtained from the memory device to generate decoded data. The ECC engine generates preprocessed data by using the decoded data and the read data, and performs second ECC decoding by using the preprocessed data when the first ECC decoding fails.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanied drawings.

Figure 1:
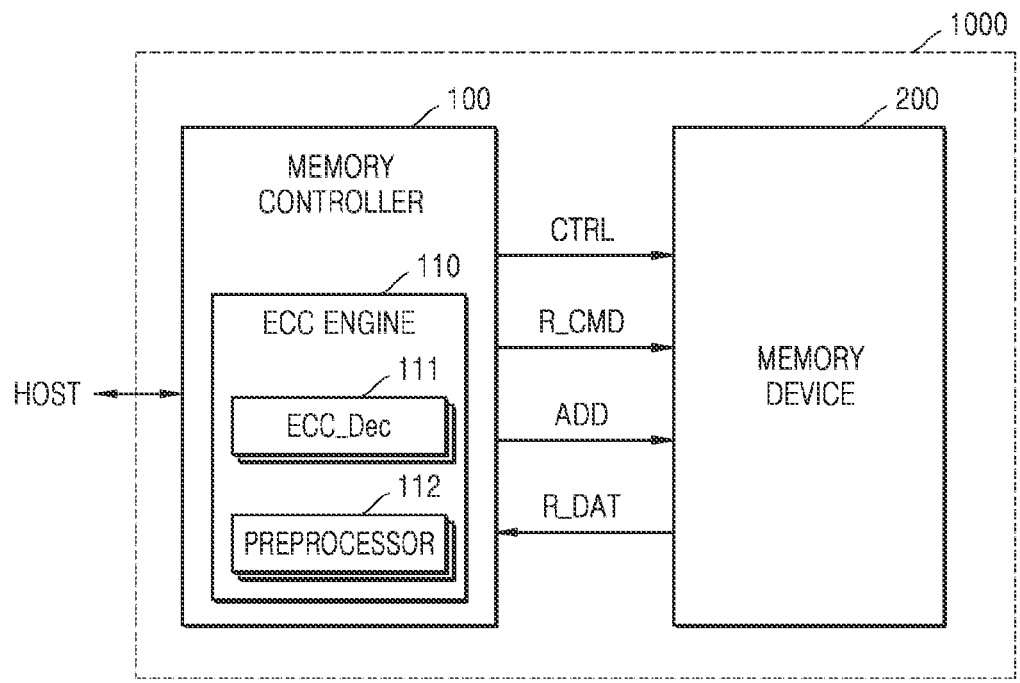
FIG. 1 is a block diagram of a storage device according to an example embodiment of the inventive concept.

FIG. 1 is a block diagram of a storage device according to an example embodiment of the inventive concept.

Referring to FIG. 1, a storage device 1000 includes a memory controller 100 (e.g., a control circuit) and a memory device 200.

The memory controller 100 may control the memory device 200, in response to write/read requests from a host, to read data stored in the memory device 200 or write the data to the memory device 200. In detail, the memory controller 100 may provide an address ADDR, a command (e.g., a read command R_CMD), and a control signal CTRL to the memory device 200, thereby controlling program (or write), read, and erase operations with respect to the memory device 200. In addition, data to be written and read data (e.g., read data R_DAT) may be transmitted and received between the memory controller 100 and the memory device 200.

The memory device 200 may include various kinds of memories. For example, the memory device 200 may include dynamic random access memory such as double data rate synchronous dynamic random access memory (DDR SDRAM), low power double data rate (SDRAM), graphics double data rate (GDDR) SDRAM, and rambus dynamic random access memory (RDSAM). However, embodiments of the inventive concept are not necessarily limited thereto. For example, the memory device 200 may include a non-volatile memory such as a flash memory, magnetic RAM (MRAM), ferroelectric RAM (FeRAM), phase change RAM (PRAM), and resistive RAM (ReRAM).

Although not shown, the memory device 200 may include a memory cell array, a write/read circuit, and a control logic. When the memory device 200 is a resistive memory device, the memory cell array may include resistive memory cells.

Figure 2:
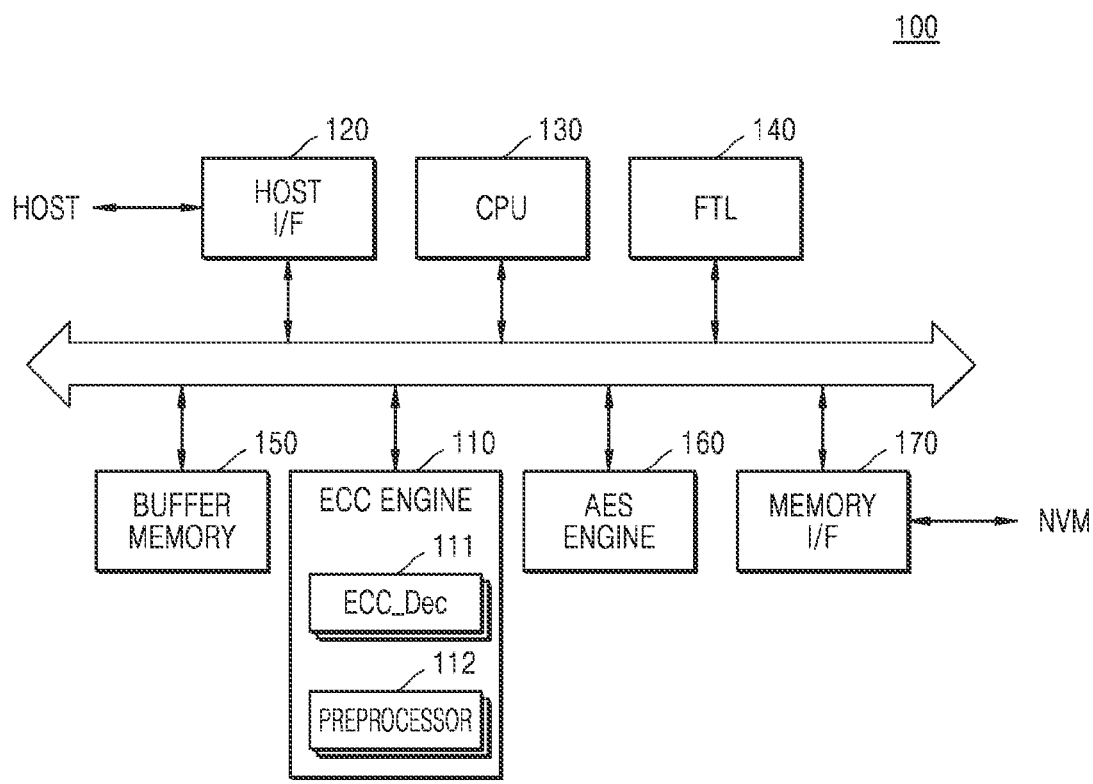
FIG. 2 is a block diagram of a memory controller according to an example embodiment of the inventive concept.

The memory controller 100 may include a host interface (for example, a host interface 120 in FIG. 2). The storage device 1000 and the host may communicate with each other through the host interface (e.g., an interface circuit).

The memory controller 100 includes an error correction code (ECC) engine 110 (e.g., an error correcting circuit), which performs an error detection and correction operation on the read data R_DAT read from the memory device 200, and may provide error-corrected read data to the host.

According to an embodiment of the inventive concept, the ECC engine 110 includes at least one ECC decoder 111 (e.g., a decoding circuit) and at least one preprocessor 112 (e.g., a processor). The ECC decoder 111 may perform a first ECC decoding operation on the read data R_DAT to generate a decoding result, determine whether the decoding succeeded or failed based on the decoding result, and may use at least one piece of intermediate data generated in the performing of the first ECC decoding operation to improve performance of a second ECC decoding operation. The preprocessor 112 may generate preprocessed data for improving the error correction capability in the ECC decoding to be performed later, by using at least one piece of the read data R_DAT and the intermediate data. By using the preprocessed data for ECC decoding, the correction capability of the ECC engine 110 may be improved.

Components shown in FIG. 1 for implementing certain functions merely represents one embodiment. The inventive concept is not limited thereto since these components may be variously modified. For example, the preprocessor 112 may be a component provided outside the ECC engine 110 in another embodiment.

FIG. 2 is a block diagram of the memory controller 100 according to an example embodiment of the inventive concept.

Referring to FIGS. 1 and 2, the memory controller 100 includes the host interface (I/F) 120, a central processing unit (CPU) 130, a flash translation layer (FTL) 140, a buffer memory 150, an ECC engine 110, an advanced encryption standards (AES) engine 160 (e.g., an encryption and/or decryption circuit), and a memory interface (I/F) 170.

In addition, the memory controller 100 may further include a packet manager, and a working memory, in which the FTL 140 is loaded, and data write and read operations with respect to a nonvolatile memory (NVM) may be controlled by execution of the FTL 140 by the CPU 130.

The host interface 120 may transmit/receive packets to/from the host. A packet transmitted from the host to the host I/F 120 may include a command or data to be written to the NVM, and a packet transmitted from the host I/F 120 to the host may include a response for the command or data read from the NVM. According to an embodiment of the inventive concept, the host interface 120 transmits decoded data, which is decoded by the ECC engine 110, to the host.

The memory I/F 170 may transmit, to the NVM, data to be written to the NVM, or may receive data read from the NVM. The memory I/F 170 may be implemented according to standard protocols such as Toggle or an Open NAND Flash Interface (ONFI).

The FTL 140 may perform various functions such as address mapping, wear-leveling, and garbage collection. An address mapping operation is an operation of converting a logical address, which is received from the host, into a physical address used for actually storing the data in the NVM. Wear-leveling is a technology for uniform usage of blocks in an NVM and prevention of excessive deterioration of specific blocks. For example, wear-leveling may be implemented through a firmware technology to balance erase counts of physical blocks. Garbage collection is a technology to secure an available capacity in the NVM by a method of copying valid data of a block to a new block and erasing the former block.

The buffer memory 150 may temporarily store data to be written to the NVM or data to be read from the NVM. The buffer memory 150 may be a component provided in the memory controller 100, but may also be outside the memory controller 100.

According to an embodiment of the inventive concept, when ECC decoding is repeatedly performed by the ECC engine 110, the buffer memory 150 may store decoded data generated as results of ECC decoding. In addition, the buffer memory 150 may temporarily store decoded data, which is successfully obtained by the ECC engine 110. The buffer memory 150 in FIG. 2 is shown outside the ECC engine 110, but may also be a component provided in the ECC engine 110.

The ECC engine 110 may perform an error detection and correction operation on the read data read from the NVM. In an exemplary embodiment, the ECC engine 110 generates parity bits from write data to be written to the NVM, and the generated parity bits is stored in the NVM together with the write data. When reading data from the NVM, the ECC engine 110 may correct errors in the read data by using the parity bits read from the NVM together with the read data to generate error-corrected read data, and may output the error-corrected read data.

The ECC engine 110 according to an embodiment of the inventive concept includes at least one ECC decoder 111 and at least one preprocessor 112. Although not shown, the ECC engine 110 may further include an ECC encoder, which generates parity bits for the write data.

In an exemplary embodiment, the ECC decoder 111 performs iteration ECC decoding on the read data. For example, a first iteration ECC decoding may include at least one decoding. With respect to the at least one decoding included in the first iteration ECC decoding, a parameter value used for each decoding may be modified. In the present specification, the performance of each decoding included in the iteration decoding may be referred to as a performance of iteration. In an embodiment, a first ECC decoding is performed on read data using a parameter set to a first parameter value to generate a result, the parameter is set to a second other parameter value based on the result, and a second ECC decoding is performed on the read data using the parameter set to the second parameter value.

The ECC decoder 111 may correct error bits included in the write data while iteratively performing decoding operations.

The ECC decoder 111 may perform iteration ECC decoding on the read data and generate decoded data as a result of each iteration of the iteration ECC decoding. The ECC decoder 111 may determine whether the decoding succeeded or failed, based on the decoded data generated for each iteration of the iteration ECC decoding. When the decoding succeeded or an end condition (or multiple end conditions) of the iteration decoding is fulfilled, the ECC decoder 111 may end the iteration ECC decoding. Conditions for ending iteration ECC decoding may be preset. For example, when the number of iterations reaches a maximum number of iterations, iteration ECC decoding may end.

Among the plurality of pieces of decoded data generated while performing iteration ECC decoding, the ECC decoder 111 may store at least one piece of decoded data as the intermediate data. The decoded data stored as the intermediate data may be the one closest to a decoding success among the plurality of pieces of decoded data. As an example, data close to a decoding success may be data with a low error rate among the plurality of pieces of decoded data. Various techniques may be used to calculate error rates of the pieces of decoded data. For example, a syndrome or a checksum of the decoded data may be used to calculate the error rates.

When a syndrome is used, the ECC decoder 111 may generate a syndrome vector by multiplying the decoded data by a parity check array, and may confirm the number of 0s or 1s included in the syndrome vector. For example, a syndrome vector including more 0s may be determined to be closer to a decoding success.

The ECC decoder 111 may calculate a syndrome of first decoded data generated in an iteration ECC decoding process. The first decoded data may be stored in the buffer memory 150 or a separated buffer (not shown) in the ECC engine 110. Afterward, the ECC decoder 111 may perform a next ECC decoding to generate second decoded data, calculate a syndrome of the second decoded data, and may compare the syndrome of the first decoded data to the syndrome of the second decoded data.

According to the above-described example, the ECC decoder 111 may determine a syndrome vector including more 0s between a syndrome vector of the first decoded data and a syndrome vector of the second decoded data. The ECC decoder 111 may perform a next iteration based on a result of the determination, or update the stored intermediate data to the second decoded data.

When the ECC engine 110 includes a plurality of ECC decoders 111, the respective ECC decoders 111 may sequentially perform ECC decoding. For example, when decoding by a first ECC decoder fails, a second ECC decoder may perform decoding. The first ECC decoder and the second ECC decoder may each perform the iteration ECC decoding until an iteration end condition is fulfilled (or until multiple end conditions are fulfilled). Performing of the iteration ECC decoding, storing and updating of the intermediate data, by the ECC decoder 111, will be described in detail with reference to FIGS. 4 and 9.

When decoding by the ECC decoder 111 fails, the preprocessor 112 may perform various operations to be described later. The preprocessor 112 may perform preprocessing by using the decoded data, which is stored by the ECC decoder 111 as the intermediate data. When the ECC engine 110 includes a plurality of preprocessors 112, each of the plurality of preprocessors 112 may be connected between a plurality of ECC decoders 111.

In an embodiment, the preprocessor 112 generates data (hereinafter, referred to as preprocessed data) by using at least one of the read data and the intermediate data provided through the memory I/F 170. Operations of the preprocessor 112 will be described in detail with reference to FIGS. 5 and 10.

The AES engine 160 may perform, by using a symmetric-key algorithm, at least one of an encryption operation and a decryption operation on the data input to the memory controller 100.

Figure 3:
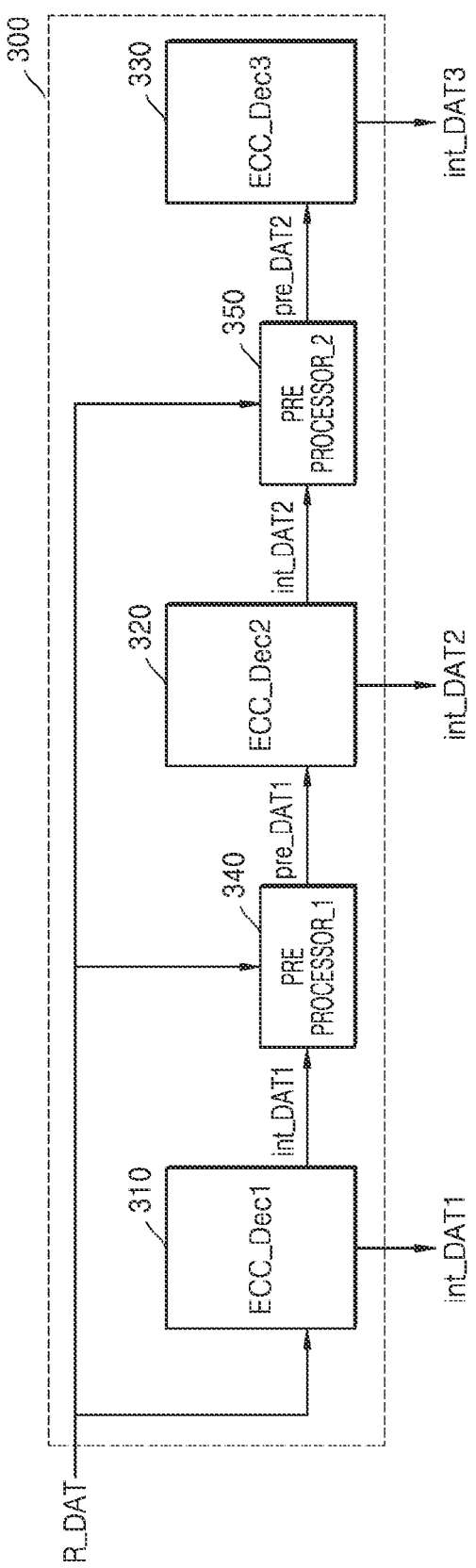
FIG. 3 is a block diagram of an error correction code (ECC) engine according to an example embodiment of the inventive concept.
Figure 4A:
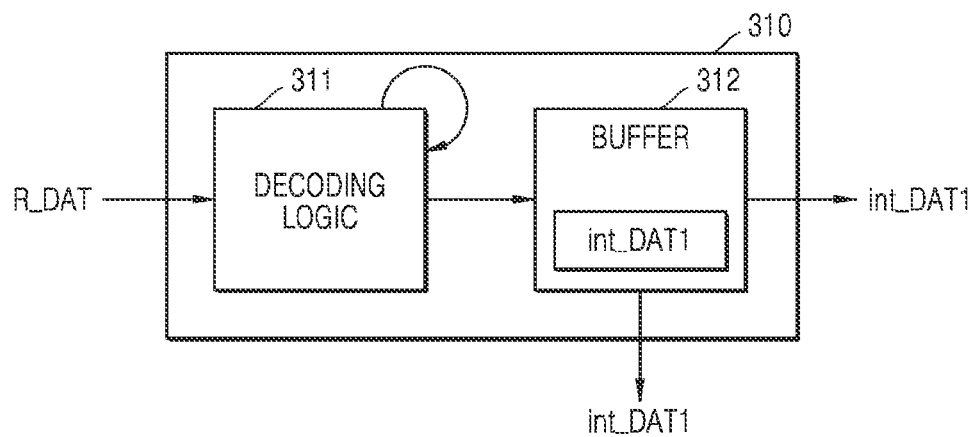
FIGS. 4A and 4B are block diagrams of ECC decoders according to example embodiments of the inventive concept.
Figure 4B:
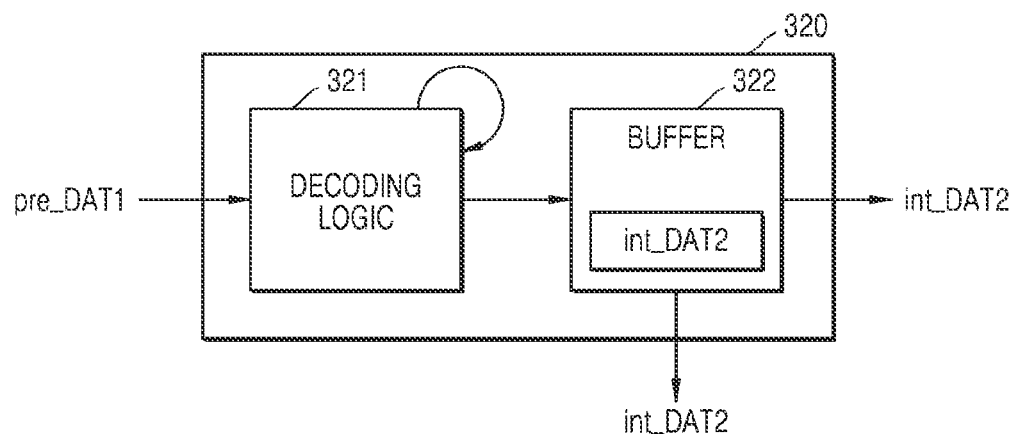
Figure 5:
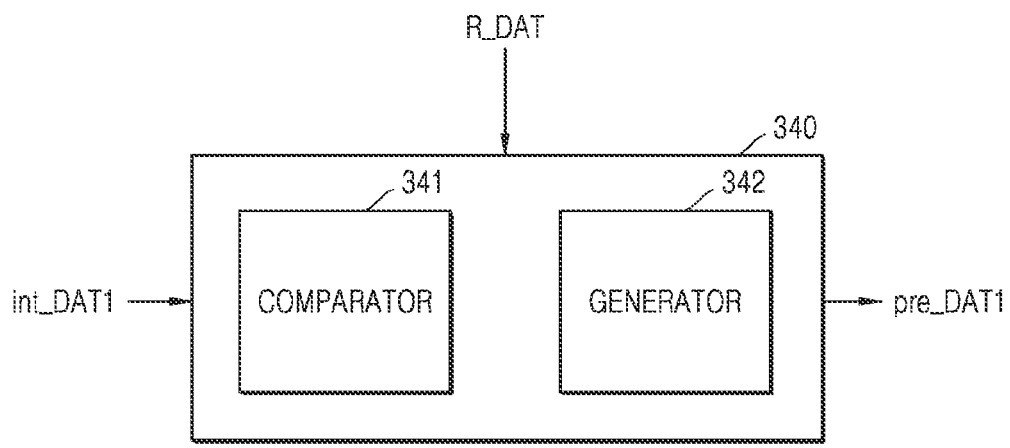
FIG. 5 is a block diagram of a pre-processor according to an example embodiment of the inventive concept.
Figure 6:
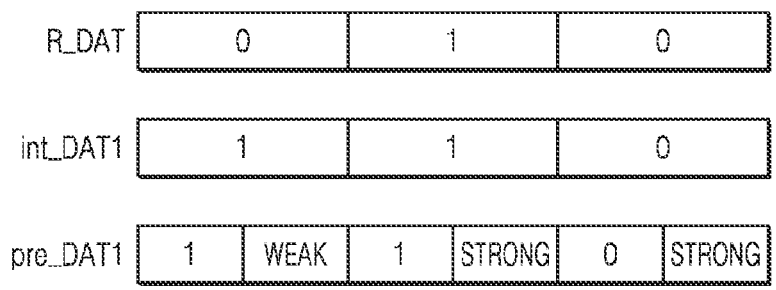
FIG. 6 is an example of a plurality of data according to an example embodiment of the inventive concept.

FIG. 3 is a block diagram of an ECC engine according to an example embodiment of the inventive concept; FIGS. 4A and 4B are block diagrams of ECC decoders according to example embodiments of the inventive concept; FIG. 5 is a block diagram of a preprocessor according to an example embodiment of the inventive concept; and FIG. 6 is an example diagram of a plurality of pieces of data according to an example embodiment of the inventive concept.

Referring to FIGS. 1 to 3, an ECC engine 300 includes a plurality of ECC decoders (i.e., a first ECC decoder 310, a second ECC decoder 320, and a third ECC decoder 330) and a plurality of preprocessors (i.e., a first preprocessor 340 and a second preprocessor 350). The ECC engine 110 of FIG. 2 may be implemented using ECC engine 300.

The plurality of ECC decoders 310 to 330 and the plurality of preprocessors 340 and 350 may be implemented in an alternately connected structure. For example, a given one of the preprocessors may be connected between a pair of the ECC decoders and given one of the ECC decoders may be connected between a pair of the preprocessors.

The ECC engine 300 may receive the read data R_DAT from the memory device 200 through the memory I/F 170. Each of the plurality of ECC decoders 310 to 330 may perform iteration decoding.

The ECC engine 300 may include the first decoder 310 through the third ECC decoder 330, the first preprocessor 340, and the second preprocessor 350.

Compared to the second ECC decoder 320, the first ECC decoder 310 may have a lower cost, a smaller area, lower power consumption, a shorter correction time, or lower correction capability. Compared to the third ECC decoder 330, the second ECC decoder 320 may have a lower cost, a smaller area, lower power consumption, a shorter correction time, or lower correction capability. In an exemplary embodiment, the first ECC decoder 310 has a first correction capability that is higher than a second correction capability of the second ECC decoder 320, and the third ECC decoder 330 has a third correction capability that is higher than the second correction capability.

When the first ECC decoder 310 succeeds in decoding data to generate decoded data, the first ECC decoder 310 may transmit the decoded data to the host through the host I/F 120. When the first ECC decoder 310 fails in decoding the data, the second ECC decoder 320 performs an ECC decoding on the data. When the second ECC decoder 320 succeeds in decoding the data, the decoded data may be output to the host, and when the second ECC decoder 320 fails in decoding the data, the third ECC decoder 330 may perform decoding.

Referring to FIG. 4A, the first ECC decoder 310 may perform iteration ECC decoding by using a decoding logic 311 (e.g., a logic circuit), based on the read data R_DAT. Intermediate data may be generated based on decoded data generated in each iteration. The generated intermediate data may be stored in a buffer 312 in the first ECC decoder 310.

Unlike that shown in FIG. 4A, the buffer 312 may be provided outside the first ECC decoder 310.

The intermediate data stored in the buffer 312 may be updated each time the decoding logic 311 performs an iteration, and when the iteration ends, the intermediate data may include decoded data with a lowest error rate among the pieces of decoded data generated from the first ECC decoder 310.

When the iteration decoding of the first ECC decoder 310 fulfills an end condition (or multiple end conditions), it may be determined whether the decoding succeeded. As another example, it may be determined whether the decoding succeeded even when the iteration decoding does not fulfill the end condition.

When decoding succeeds, the first ECC decoder 310 may output stored first intermediate data int_DAT1 to the host. When decoding fails, the first ECC decoder 310 may output the stored first intermediate data int_DAT to the first preprocessor 340.

Referring to FIG. 5, in an embodiment, the first preprocessor 340 operates when the first ECC decoder 310 fails in decoding. The first preprocessor 340 may receive the first intermediate data int_DAT1 from the first ECC decoder 310, and may receive the read data R_DAT through the memory I/F 170. In an embodiment, the first preprocessor 340 generates first preprocessed data pre_DAT1 by using the first intermediate data int_DAT1 and the read data R_DAT, and provides the first preprocessed data pre_DAT1 to the second ECC decoder 320.

In an embodiment, the first preprocessor 340 includes a comparator 341 (e.g., a comparator circuit) and a generator 342 (e.g., a logic circuit). The comparator 341 may compare bits in the same positions of the read data R_DAT and the first intermediate data int_DAT1 to determine whether the bits are identical to each other. The generator 342 may generate first preprocessed data pre_DAT1 including reliability information of each bit, based on whether the bits are identical to each other.

Referring to FIG. 6, the read data R_DAT may be 010, and the first intermediate data int_DAT1 may be 110. The comparator 341 may compare a bit in the read data R_DAT to a bit in a same digit of the first intermediate data int_DAT1 to determine whether the bits are identical to each other. In FIG. 6, it is assumed that the read data R_DAT is hard decision (HD) data, but the embodiment is not limited thereto, and the read data R_DAT may be soft decision (SD) data including the reliability of each bit.

The first intermediate data int_DAT1 indicates error-corrected data by the first ECC decoder 310, and therefore, same bits in the read data R_DATA and the first intermediate data int_DAT1 may indicate that the bits have strong reliability. In addition, the difference in the bit of the read data R_DAT and the bit of the first intermediate data int_DAT1 may indicate that the bits have weak reliability.

Since a first bit of the read data R_DAT is 0 and a first bit of the first intermediate data int_DAT1 is 1, the first preprocessor 340 may determine a bit of a corresponding digit as 1, and the bit 1 may have weak reliability. Since a second bit of the read data R_DAT is 1, and a second bit of the first intermediate data int_DAT1 is also 1, the first preprocessor 340 may determine a bit of a corresponding digit as 1, and the bit 1 may have strong reliability.

When a bit of the read data R_DAT is different from a bit of the intermediate data, the bit of the intermediate data may be followed, or alternatively, the bit of the read data R_DAT may also be followed. In addition, each bit might not be adjacent to a bit having reliability information.

In addition, the preprocessor may generate SD type preprocessed data, but is not limited thereto. The preprocessor may also generate HD type preprocessed data only including bits constructing data.

Referring to FIG. 4B, the second ECC decoder 320 receives the first preprocessed data pre_DAT1 from the preprocessor 340, and performs iteration ECC decoding by using a decoding logic 321, based on the first preprocessed data pre_DAT1.

The decoding logic 321 of the second ECC decoder 320 may be different from the decoding logic 311 of the first ECC decoder 310. For example, the decoding logic 321 of the second ECC decoder 320 may have higher correction capability and/or a longer correction time compared to those of the decoding logic 311 of the first ECC decoder 310.

In an exemplary embodiment, the decoding logic 321 of the second ECC decoder 320 performs iteration ECC decoding by using reliability information of each bit included in the first preprocessed data pre_DAT1. Similar to the operation of the first ECC decoder 310, the second ECC decoder 320 may store, in the buffer 322, decoded data with a lowest error rate among decoded data generated in the respective iterations. The data stored in the buffer 322 may be referred to as second intermediate data int_DAT2. A bit rate of the second intermediate data int_DAT2 may be identical to a bit rate of the read data R_DAT.

When an iteration end condition is fulfilled, the second ECC decoder 320 may determine whether decoding succeeded. When decoding succeeded, the second ECC decoder 320 may output the second intermediate data int_DAT2 to the host, and when decoding fails, the second ECC decoder 320 may output the second intermediate data int_DAT2 to the second preprocessor 350.

When decoding fails, the second preprocessor 350 may perform an operation similar to that of the first preprocessor 340. That is, the second preprocessor 350 may generate second preprocessed data pre_DAT2 by using the second intermediate data int_DAT2 and the read data R_DAT, and may provide the second preprocessed data pre_DAT2 to the third ECC decoder 330. An operation of the third ECC decoder 330 may be similar to that of the second ECC decoder 320 described above.

Unlike that shown in FIG. 4B, the buffer 322 may be provided outside the second ECC decoder 320.

Figure 7:
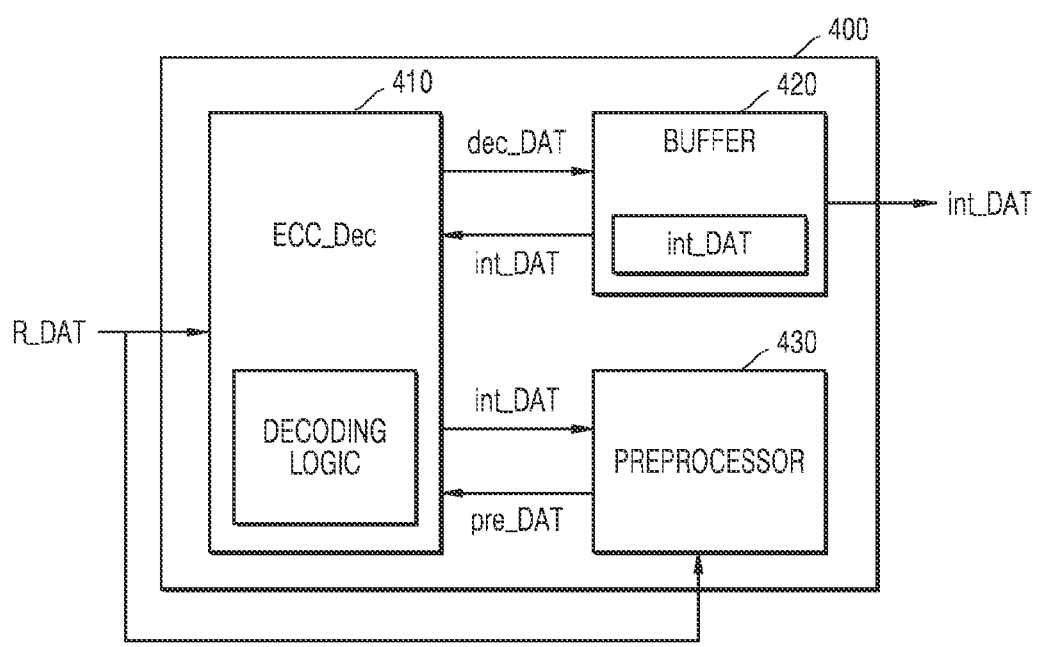
FIG. 7 is a block diagram of an ECC engine according to another example embodiment of the inventive concept.

FIG. 7 is a block diagram of an ECC engine according to an example embodiment of the inventive concept.

Referring to FIG. 7, unlike in FIG. 3, an ECC engine 400 includes an ECC decoder 410 and a preprocessor 430. In this case, the ECC decoder 410 may perform the operations of the first ECC decoder 310 through the third ECC decoder 330 (see FIG. 3), and the preprocessor 430 may perform the operations of the first preprocessor 340 and the second preprocessor 350. The ECC engine 110 of FIG. 2 may be implemented by the ECC engine 400.

The ECC engine 400 may support a plurality of decoding modes. The ECC engine 400 may perform operations of the respective ECC decoders in FIG. 3 by changing the decoding modes. For example, when the ECC engine 400 is in a first decoding mode, the ECC engine 400 may perform the operation of the first ECC decoder 310. In the first decoding mode, the ECC engine 400 may perform the first iteration ECC decoding. Decoding parameters used in the respective decoding modes may be different from one another. For example, compared to a second ECC mode, the first decoding mode may have a lower cost, a smaller area, lower power consumption, a shorter correction time, or lower correction capability.

The ECC decoder 410 may receive the read data R_DAT from the memory device and perform the first iteration ECC decoding by using a decoding logic. The first iteration ECC decoding may be similar to, for example, the decoding operation of the first ECC decoder 310 shown in FIG. 3.

The first iteration ECC decoding may include at least one iteration. In each iteration, decoded data dec_DAT may be generated, and an error rate of the decoded data dec_DAT may be calculated.

The ECC decoder 410 may compare error rates of the decoded data dec_DAT generated through repeated decoding and the intermediate data int_DAT stored in the buffer 420, and may store data with a lower error rate in the buffer 420. By doing so, the intermediate data int_DAT may be iteratively updated to decoded data with a lowest error rate.

When the first iteration ECC decoding ends, the ECC decoder 410 may determine whether decoding succeeded, based on the intermediate data int_DAT stored in the buffer 420. When decoding succeeded, the ECC decoder 410 may output the intermediate data int_DAT, which is stored in the buffer 420, to the host. When decoding failed, the ECC decoder 410 may provide the intermediate data int_DAT to the preprocessor 430.

When decoding failed, the preprocessor 430 may generate the preprocessed data pre_DAT based on the read data R_DAT and the intermediate data int_DAT, and may provide the preprocessed data pre_DAT to the ECC decoder 410. In an embodiment, the preprocessed data pre_DAT includes the intermediate data int_DAT and reliability information for each bit of the intermediate data int_DAT.

The ECC decoder 410, based on the preprocessed data pre_DATA, may perform second iteration ECC decoding by using a decoding logic that is different from the decoding logic used in the first iteration decoding. To perform the second iteration ECC decoding, the ECC decoder 410 may change the decoding mode from the first decoding mode to the second decoding mode.

Parameters used for the first iteration decoding may be different from parameters used for the second iteration decoding. When the first iteration ECC decoding includes a plurality of decoding operations and the second iteration ECC decoding also includes a plurality of decoding operations, the parameters for the decoding operations performed in the first iteration decoding process may be different from the parameters for the decoding operations performed in the second iteration ECC decoding process. The second iteration ECC decoding may be similar to, for example, the decoding operation of the second ECC decoder 320 shown in FIG. 3.

The ECC decoder 410 may perform up to $n^{th}$ iteration decoding (where n is a natural number equal to or greater than 1), and n may be determined by the host or the memory controller.

Figure 8:
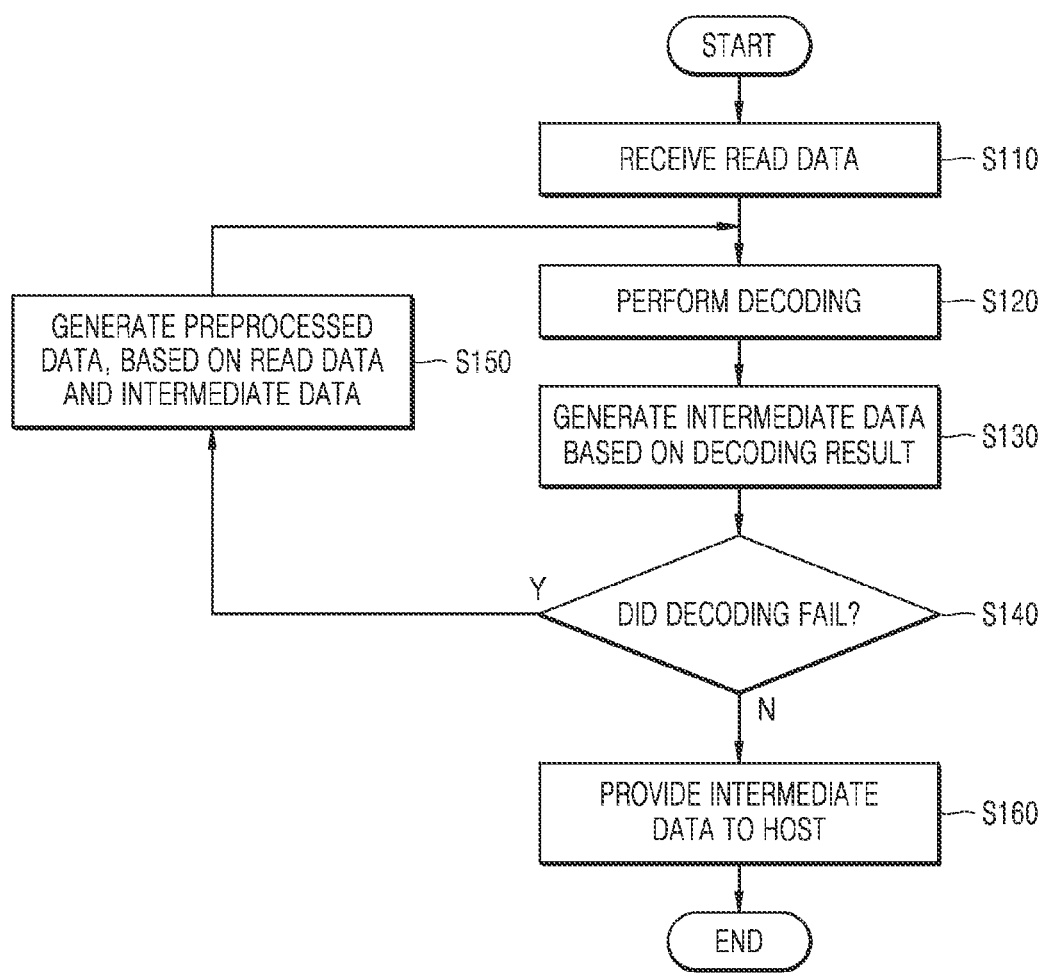
FIG. 8 is a flowchart of an operation method of a memory controller according to an example embodiment of the inventive concept.

FIG. 8 is a flowchart of an operation method of the memory controller according to an example embodiment of the inventive concept.

Referring to FIGS. 1 and 8, the memory controller 100 receives the read data R_DAT from the memory device 200.

The memory controller 100 performs decoding (e.g., an ECC decoding) on the read data R_DAT (S120). The decoding may be performed in an iteration decoding method, and parameters used for decoding may be changed in each iteration.

The memory controller 100 generates and stores intermediate data, based on a decoding result (S130). The intermediate data may be decoded data with a lowest error rate among a plurality of pieces of decoded data generated by the iteration decoding. Various methods may be used to calculate an error rate of decoded data. For example, the iteration decoding could include performing a first ECC decoding on the read data R_DAT using an ECC decoder configured with a first parameter to generate first decoded data and performing a second ECC decoding on the read data R_DAT using the ECC decoder configured with a second other parameter to generate second decoded data, and the intermediate data could be one of the first decoded data and the second decoded data that has a lowest error rate.

The memory controller 100 determines whether decoding failed (S140). For example, if the intermediate data has errors, it could be considered a decoding failure. For example, if the intermediate data has no errors or a 0 error rate, it could be considered a decoding success.

When decoding failed, the memory controller 100 preprocesses the read data R_DAT and the intermediate data to generate preprocessed data (S150), and performs decoding again on the preprocessed data (S120).

When decoding succeeded, the memory controller 100 provides the stored intermediate data to the host.

Figure 9:
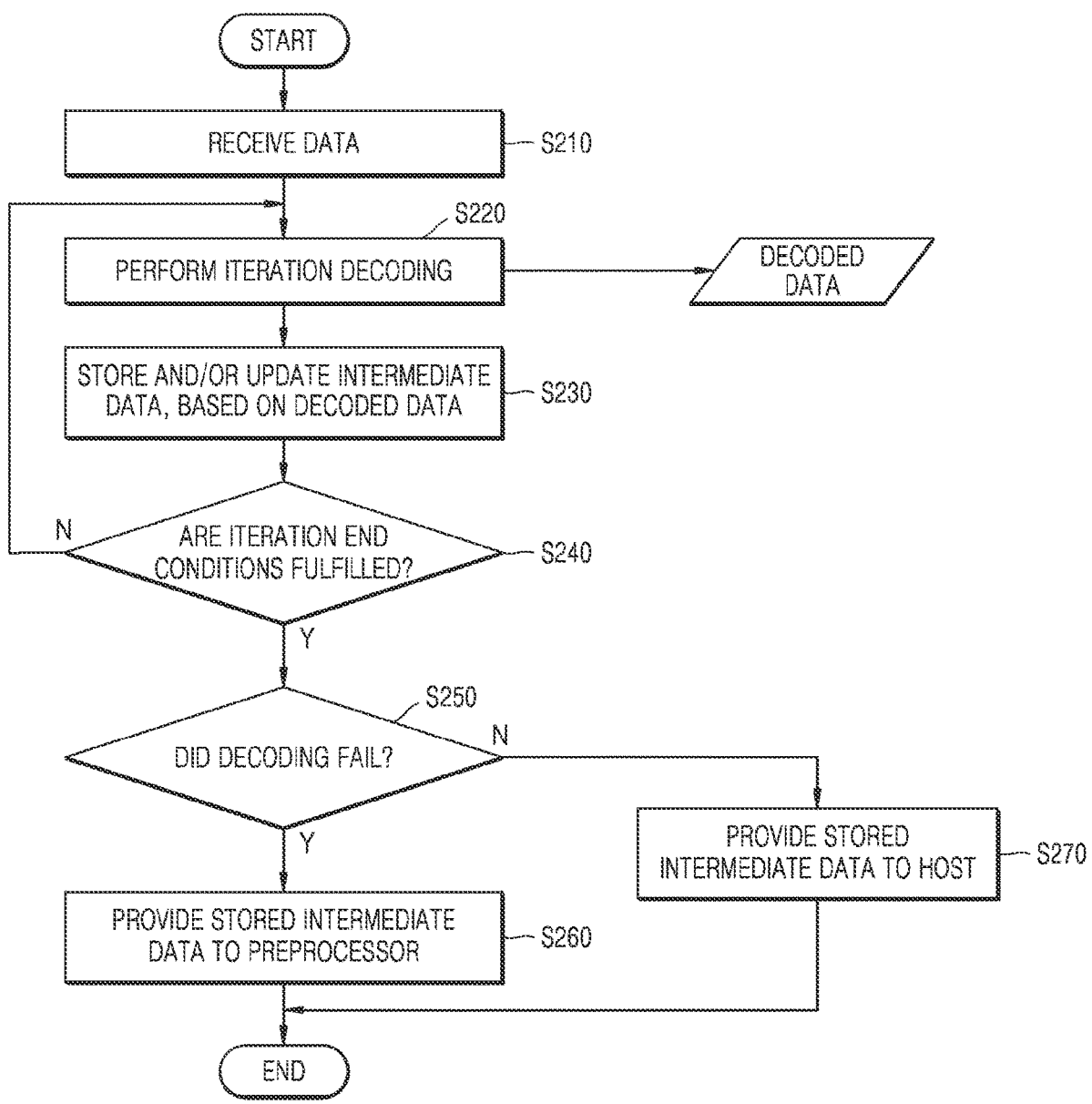
FIG. 9 is a flowchart of an operation method of an ECC decoder according to an example embodiment of the inventive concept.

FIG. 9 is a flowchart of an operation method of the ECC decoder according to an example embodiment of the inventive concept.

Hereinafter, for convenience of explanation, a configuration in which the ECC engine 400 includes the ECC decoder 410 and the preprocessor 430 is used, but a structure of the ECC engine 400 is not limited thereto.

Referring to FIGS. 7 and 9, the ECC decoder 410 receives data to be decoded (S210). Here, the data may be the read data R_DAT obtained from the memory device or the preprocessed data pre_DAT obtained from the preprocessor 430.

The ECC decoder 410 performs iteration decoding (S220). In each iteration, decoded data dec_DAT may be generated as a decoding result. The ECC decoder 410 may calculate a metric for estimating the generated decoded data dec_DAT. For example, the metric may be a decoding success probability or an error rate.

Based on the decoded data dec_DAT, the ECC decoder 410 may store the decoded data dec_DAT as the intermediate data int_DAT in the buffer 420, or may update the intermediate data int_DAT, which is already stored, to the decoded data dec_DAT (S230). Detailed description thereof will be given with reference to FIG. 10.

The ECC decoder 410 determines whether an iteration end condition is fulfilled (S240). For example, when a maximum number of iterations is reached or decoding succeeded, the iteration end condition may be fulfilled, and therefore, the iteration decoding may end.

When the iteration end condition is not fulfilled, the ECC decoder 410 may perform the iteration decoding again. Here, parameters used in previous iteration decoding may be different from parameters used in next iteration decoding.

When the iteration end condition is fulfilled, the ECC decoder 410 determines whether decoding failed (S250). One of various methods for determining whether decoding failed may be applied. In the case decoding succeeded and iteration ends, the process may proceed from operation S240 directly to operation S260.

In FIG. 9, it is first determined whether the iteration end condition is fulfilled, and then it is again determined whether decoding failed, but determination orders may be changed. That is, it may be first determined whether decoding failed, and then, it may be determined whether the iteration end condition is fulfilled.

When the decoding failed, the ECC decoder 410 provides the stored intermediate data int_DAT to the preprocessor 430 (S260).

When the decoding succeeded, the ECC decoder 410 provides the stored intermediate data int_DAT to the host (S270). When the ECC decoder 410 performs iteration decoding, decoded data dec_DAT estimated as being closest to decoding success may be stored as the intermediate data int_DAT. Accordingly, success in decoding may indicate that decoding succeeded with respect to the intermediate data int_DAT.

According to the present embodiment, the ECC decoder 410 may perform iteration ECC decoding and store the decoded data dec_DATA, which is closest to the decoding success, as the intermediate data int_DAT, and may provide the intermediate data int_DAT when the decoding failed. By doing so, error-corrected data compared to the read data R_DAT may be used in a next ECC decoding. Therefore, the correction capability of the ECC engine 400 may be improved.

Figure 10:
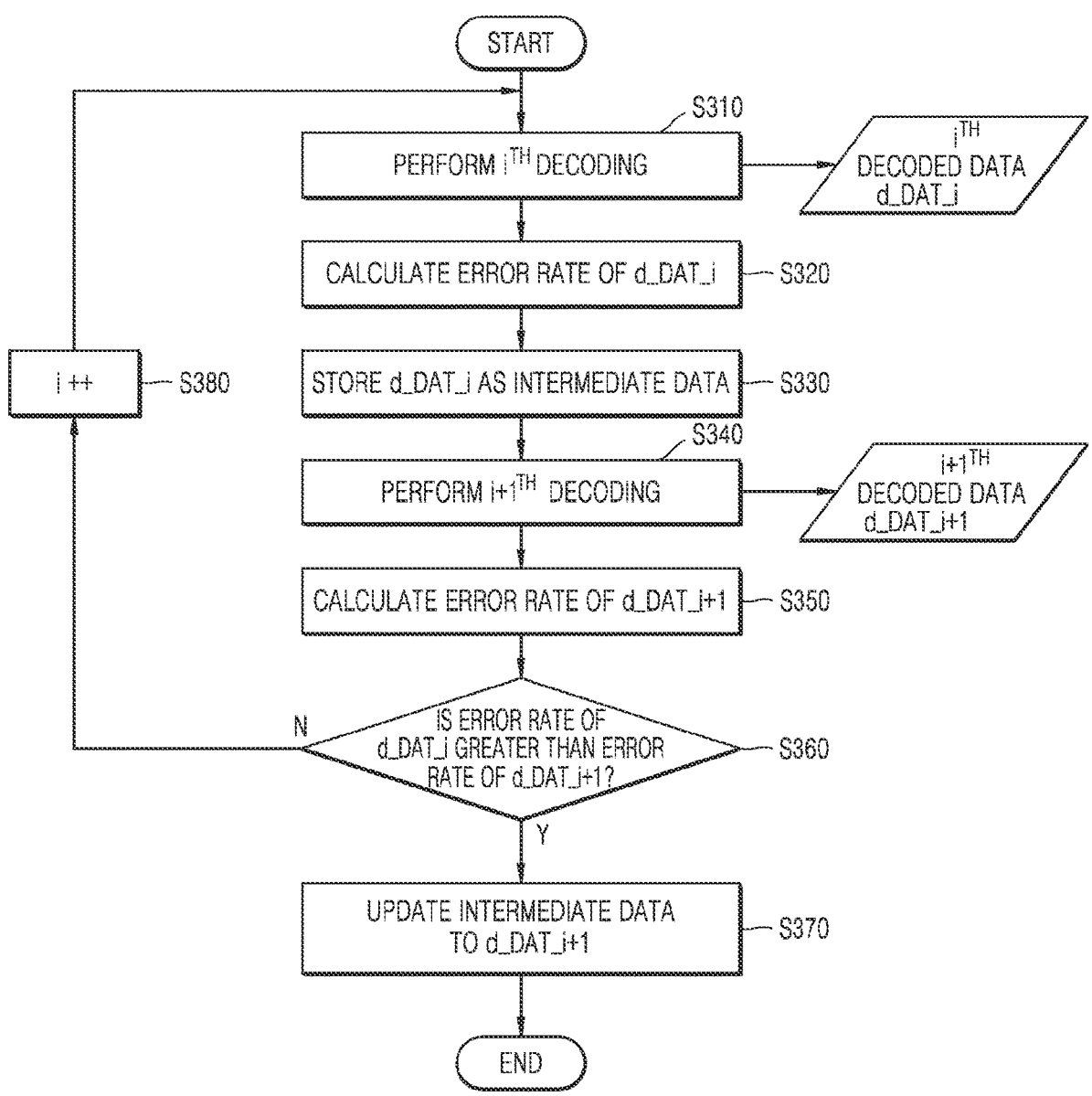
FIG. 10 is a flowchart of an operation method of an ECC decoder according to an example embodiment of the inventive concept.

FIG. 10 is a flowchart of an operation method of the ECC decoder according to an example embodiment of the inventive concept.

Referring to FIGS. 7 and 10, the ECC decoder 410 may store the intermediate data int_DAT in the buffer 420, or may update the intermediate data int_DAT that is already stored in the buffer 420. The buffer 420 may be provided in the ECC decoder 410. In addition, the ECC decoder 410 may perform iteration decoding.

The ECC decoder 410 performs an $i^{th}$ decoding to generate $i^{th}$ decoded data d_DAT_i as a result thereof (S310). Data to be decoded may be the read data R_DAT or the preprocessed data pre_DAT.

The ECC decoder 410 calculates an error rate of the $i^{th}$ decoded data d_DAT_i (S320). The ECC decoder 410 may calculate an index, which may be used for determining whether decoding of the $i^{th}$ decoded data d_DAT_i succeeded. The error rate may be calculated and used as the index. A checksum or a syndrome may be used as an example of an error rate or to determine the error rate.

The ECC decoder 410 stores the $i^{th}$ decoded data d_DAT_i in the buffer 420 (S330). The data stored in the buffer 420 may be referred to as the intermediate data int_DAT. Operation S330 may be performed when the intermediate data int_DAT is not stored in the buffer 420. When the intermediate data int_DAT is already stored in the buffer 420, operations similar to S360 and S370 to be described later may be performed. For example, an error rate of the stored intermediate data int_DAT may be compared to the error rate of the $i^{th}$ decoded data d_DAT_i, and when the error rate of the $i^{th}$ decoded data d_DAT_i is lower than the error rate of the stored intermediate data int_DAT, the intermediate data int_DAT may be updated to the $i^{th}$ decoded data d_DAT_i.

The ECC decoder 410 may also store the error rate of the $i^{th}$ decoded data d_DAT_i in the buffer 420, in addition to the $i^{th}$ decoded data d_DAT_i.

The ECC decoder 410 performs $i+1^{th}$ decoding to generate $i+1^{th}$ decoded data d_DAT_i+1 as a result thereof (S340). For example, the ECC decoder 410 may perform the $i+1^{th}$ decoding on the read data R_DAT. In an embodiment, a parameter of the $i+1^{th}$ decoding differs from a parameter of the $i^{th}$ decoding.

The ECC decoder 410 calculates an error rate of the $i+1^{th}$ decoded data d_DAT_i+1 (S350).

The ECC decoder 410 compares the error rate of the $i^{th}$ decoded data d_DAT_i to the error rate of the $i+1^{th}$ decoded data d_DAT_i+1 (S360). When the error rate of the $i^{th}$ decoded data d_DAT_i exceeds (or is equal to or greater than) the error rate of the $i+1^{th}$ decoded data d_DAT_i+1, the intermediate data int_DAT is updated in the buffer 420 to the $i+1^{th}$ decoded data d_DAT_i+1 (S370).

When the error rate of the $i^{th}$ decoded data d_DAT_i exceeds (or is less than) the error rate of the i+1 decoded data d_DAT_i+1, the ECC decoder 410 performs a next iteration with the $i^{th}$ decoded data d_DAT_i stored in the buffer 420 (S380).

Through the above-described operations, when the iteration of the ECC decoder 410 ends, the decoded data with the lowest error rate may be stored in the buffer 420.

Figure 11:
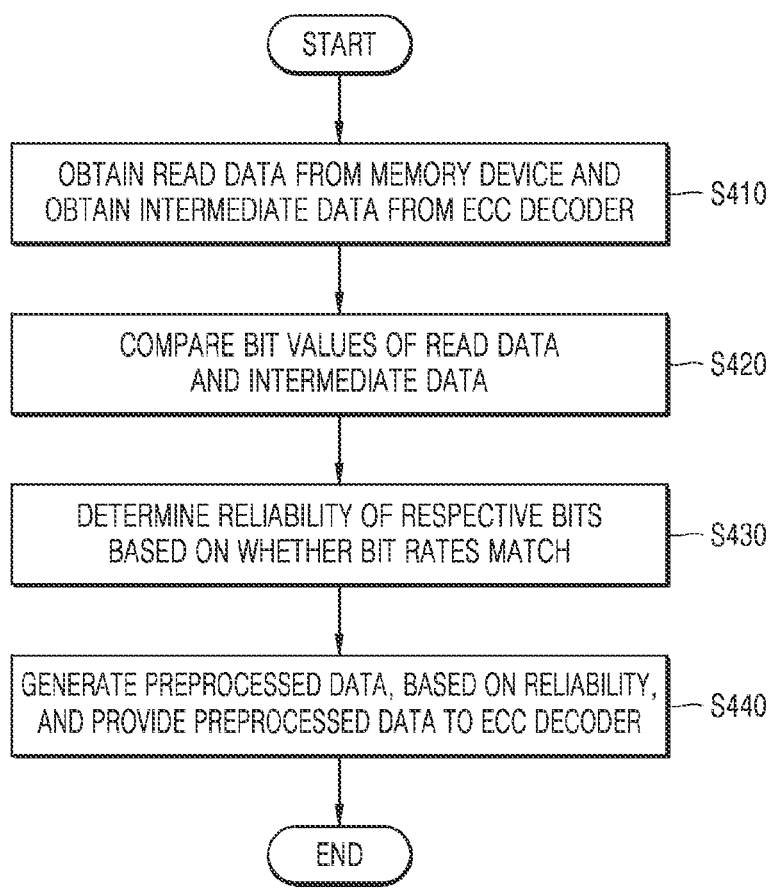
FIG. 11 is a flowchart of an operation method of a preprocessor according to an example embodiment of the inventive concept.

FIG. 11 is a flowchart of an operation method of the preprocessor according to an example embodiment of the inventive concept.

Referring to FIGS. 3, 5, and 11, when the decoding of the first ECC decoder 310 connected to a front end failed, the preprocessor 340 may obtain the intermediate data int_DAT1 from the first ECC decoder 310 and perform a series of operations. Accordingly, the following operations will be described under the assumption that the decoding by the first decoder 310 failed.

The preprocessor 340 obtains the read data R_DAT from the memory device and obtains the intermediate data int_DAT1 from the first ECC decoder 310 (S410). For example, the read data R_DAT may be 010, and the intermediate data int_DAT1 may be 110.

The preprocessor 340 compares the respective bits of the read data R_DAT to the respective bits of the intermediate data int_DAT1 (S420).

The preprocessor 340 determines the reliability of the respective bits based on whether the respective bits match one another (S430). For example, when a highest bit of the read data R_DAT is 0 and a highest bit of the intermediate data int_DAT1 is 1, which are different from each other, the highest bit of the read data R_DAT and/or the highest bit of the intermediate data int_DAT may have weak reliability. When a lowest bit of the read data R_DAT is 1 and a lowest bit of the intermediate data int_DAT1 is also 1, which are identical to each other, the lowest bit of the read data R_DAT and/or the lowest bit of the intermediate data int_DAT1 may have strong reliability.

The preprocessor 340 generates preprocessed data pre_DAT1 based on the reliability of the respective bits, and provides the preprocessed data pre_DAT1 to the second ECC decoder 320 (S440).

The generated preprocessed data pre_DAT1 may have an SD data type including the respective bits and the reliability corresponding thereto. Alternatively, the preprocessed data pre_DAT1 may have an HD data type only including the data, without including the reliability. In this case, when the bit of the read data R_DAT is different from the bit of the intermediate data DAT_1, the bit may be flipped according to any one of the bit of read data R_DAT and the bit of the intermediate data int_DAT1. When the preprocessed data pre_DAT1 is HD data, the preprocessor 340 may provide separate reliability information to the second ECC decoder 320 at the back end, together with the HD data.

When an ECC engine (i.e., the ECC engine 400 in FIG. 7) is implemented as the configuration shown in FIG. 7, the ECC decoder 410 configured to provide the intermediate data int_DAT to the preprocessor 430 may be the same as the ECC decoder 410 to which the preprocessed data pre_DAT is provided.

Figure 12:
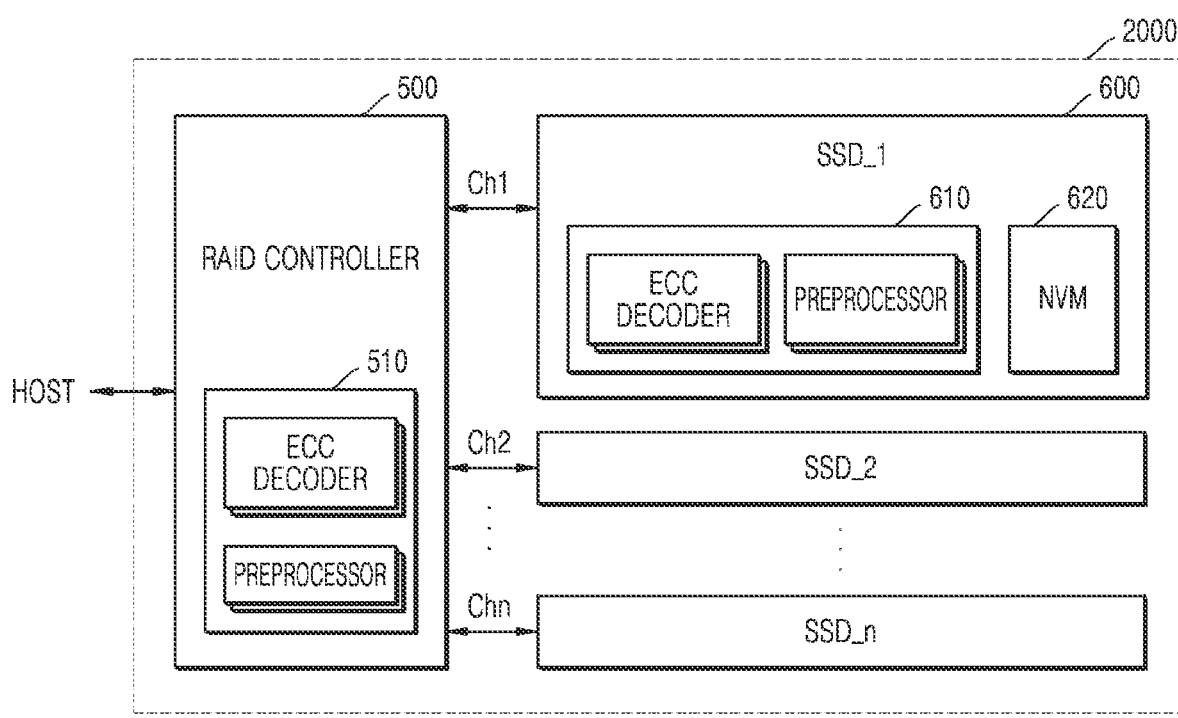
FIG. 12 is a block diagram of a storage device according to another example embodiment of the inventive concept.

FIG. 12 is a block diagram of a data storage system according to an example embodiment of the inventive concept.

The above-described ECC decoding operations may be applied to a data storage system 2000. As an example, a redundant array of inexpensive disk (RAID) technology may be applied to the data storage system 2000.

Referring to FIG. 12, the data storage system 2000 includes a RAID controller 500 and a plurality of solid state drives (SSDs) SSD_1 through SSD_n.

The RAID controller 500 may access the plurality of SSDs (i.e. SSD_1 through SSD_n) through a first channel Ch1 to an nth channel Chn, in response to a request from the host. The RAID controller 500 may be configured to control read, write, and erase operations of each of the SSDs.

Although not shown, the RAID controller 500 may configured to provide an interface between the host and the plurality of SSDs SSD_1 through SSD_n, and may further include other components such as a central processing unit (CPU) and a buffer.

The SSD_1 600 may be configured to perform the operations of the storage device (i.e., the storage device 1000 shown in FIG. 1) according to the above-described embodiments. For example, by the operation of the preprocessor to perform the ECC decoding operation on the read data read from a memory device (e.g., the memory device 200 in FIG. 1) and use the intermediate data when the decoding failed, the reliability of the error correction operation may be improved.

In addition, according to an example embodiment, the RAID controller 500 may include an ECC engine 510. A configuration of the ECC engine 510 may be similar to configurations of the ECC engine 400 described above with reference to FIGS. 1 to 11 or an ECC engine 610, and operations thereof may also be similar thereto. For example, the ECC engine 510 may include at least one ECC decoder and at least one preprocessor.

The RAID controller 500 may be provided with the read data, intermediate data, or preprocessed data from the SSD_1 600. The read data may be data read from the NVM in response to a read request from the host. The intermediate data may be decoded data having a low error rate among a plurality of pieces of decoded data generated while performing decoding in the ECC engine 510. The preprocessed data may be generated, by the ECC engine 510, based on the read data and the intermediate data.

The ECC engine 510 may perform decoding on the read data or the preprocessed data, and may generate preprocessed data by using the read data and the intermediate data.

According to an example embodiment, the ECC decoding is iteratively performed by the ECC engine 610 in the SSD_1 600. In this case, the ECC decoding may be iteratively performed by a same ECC decoder or may be performed by different ECC decoders in a same level.

As another example, the ECC decoding may be performed by ECC engines on different levels. For example, the ECC decoding may be performed by the ECC engine 610 in the SSD_1 600 and the ECC engine 510 in the RAID controller 500.

In addition, in a preprocessor according to an embodiment of the inventive concept, ECC decoders of a same level may be connected to a back end and a front end, or ECC decoders of different levels may be connected to the back end and the front end. For example, the preprocessor included in the ECC engine 610 may obtain the intermediate data from the ECC decoder included in the ECC engine 610, and may generate preprocessed data and provide the preprocessed data to the ECC decoder included in the ECC engine 510.

While the inventive concept has been particularly shown and described with reference to embodiments thereof, it will be understood that various changes in form and details may be made therein without departing from the spirit and scope of the following claims.

What is claimed is:

1. A method of responding to a read request from a host, the method comprising:
obtaining read data from a memory device;
performing first iteration error correction code (ECC) decoding on the read data to generate a plurality of pieces of decoded data;
selecting one of the plurality of pieces of decoded data as intermediate data;
generating preprocessed data based on the read data and the intermediate data and performing second iteration ECC decoding on the preprocessed data when the first iteration ECC decoding fails; and
outputting the intermediate data to the host when the first iteration ECC decoding succeeds,
wherein the performing of the second iteration ECC decoding on the preprocessed data comprises:
comparing the read data to the intermediate data;
determining a reliability of the intermediate data based on a result of the comparing; and
generating the preprocessed data based on the reliability of the intermediate data.

2. The operation method of claim 1, wherein the selecting comprises determining a piece among the plurality of pieces of decoded data having a lowest error rate as the intermediate data.

3. The operation method of claim 2, wherein the selecting comprises:
calculating a first error rate of a first piece among the pieces of decoded data;
calculating a second error rate of a second piece among the pieces of decoded data; and
comparing the first error rate to the second error rate to determine the piece having the lowest error rate.

4. The operation method of claim 3, wherein the first error rate is based on at least one of a checksum or a syndrome of the first piece of the decoded data.

5. The operation method of claim 1, wherein the comparing of the read data to the intermediate data comprises comparing bits of the read data to corresponding bits of the intermediate data to determine a match therebetween.

6. The operation method of claim 5, wherein the preprocessed data includes soft decision data, and the determining of the reliability of the intermediate data comprises, determining a reliability of a first bit value of the intermediate data as a strong level when a first bit value of the read data matches a first bit value of the intermediate data, and otherwise, determining the reliability of the first bit value of the intermediate data as a weak level.

7. The operation method of claim 5, wherein the preprocessed data includes hard decision data, and when a first bit value of the read data does not match a first bit value of the intermediate data, a first bit value of the preprocessed data is generated by flipping the first bit value of the read data.

8. An error correction code (ECC) engine comprising:
an ECC decoder configured to perform first iteration ECC decoding on read data obtained from a memory device to generate a plurality of pieces of decoded data, and select one of the plurality of pieces as intermediate data; and a preprocessor configured to generate preprocessed data based on the read data and the intermediate data when the first iteration ECC decoding fails, wherein the ECC decoder performs second iteration ECC decoding by using the preprocessed data when the first iteration ECC decoding fails, wherein the preprocessor further includes a comparator and a generator, the comparator compares the read data to the intermediate data, determines a reliability of the intermediate data based on a result of the comparing, and the generator generates the preprocessed data based on the reliability of the intermediate data.

9. The ECC engine of claim 8, wherein the ECC decoder selects the one piece by determining a piece among the plurality of pieces of decoded data having a lowest error rate.

10. The ECC engine of claim 8, wherein the preprocessor calculates a reliability of the intermediate data according to whether the read data matches the intermediate data, and generates the preprocessed data to include the intermediate data and the reliability.

11. The ECC engine of claim 8, wherein the ECC decoder comprises a first ECC decoder and a second ECC decoder, and when decoding by the first ECC decoder fails, the preprocessor receives the intermediate data from the first ECC decoder, and provides the preprocessed data to the second ECC decoder.

12. The ECC engine of claim 11, wherein the second ECC decoder has an error correction capability higher than that of the first ECC decoder.

13. The ECC engine of claim 8, wherein the ECC decoder supports a plurality of decoding modes, performs a first ECC decoding according to a first decoding mode among the decoding modes, and provides the intermediate data to the preprocessor, and performs a second ECC decoding in a second decoding mode among the decoding modes on the preprocessed data received from the preprocessor, when the first ECC decoding fails.

14. The ECC engine of claim 13, wherein the second decoding mode has an error correction capability higher than that of the first decoding mode.

\* \* \* \* \*